United States Patent
Yaris et al.

(10) Patent No.: US 12,218,676 B2
(45) Date of Patent: Feb. 4, 2025

(54) DIGITAL SWITCHING MATRIX

(71) Applicant: Turkiye Bilimsel ve Teknolojik Arastirma Kurumu, Cankaya Ankara (TR)

(72) Inventors: Nuri Yaris, Ankara (TR); Huseyin Aniktar, Ankara (TR)

(*) Notice: Subject to any disclaimer, the term of this patent is extended or adjusted under 35 U.S.C. 154(b) by 6 days.

(21) Appl. No.: 17/894,452

(22) Filed: Aug. 24, 2022

(65) Prior Publication Data

US 2023/0064778 A1    Mar. 2, 2023

(51) Int. Cl.
   *H03M 1/00*   (2006.01)
   *H03K 19/177* (2020.01)
   *H03M 1/12*   (2006.01)

(52) U.S. Cl.
   CPC .......... *H03M 1/001* (2013.01); *H03K 19/177* (2013.01); *H03M 1/00* (2013.01); *H03M 1/12* (2013.01)

(58) Field of Classification Search
   CPC .......... H03M 1/001; H03M 1/00; H03M 1/12; H03K 19/177
   See application file for complete search history.

(56) References Cited

U.S. PATENT DOCUMENTS 5,451,936 A * 9/1995 Yang ............ H04Q 3/68
                                              370/388

\* cited by examiner

*Primary Examiner* — Joseph J Lauture
(74) *Attorney, Agent, or Firm* — Crose Law LLC; Bradley D. Crose

(57) ABSTRACT

The present invention provides the signals received from different antennas (100) in a certain frequency range with micro-miniature input connectors (101) on a printed circuit, amplified and filtered with the help of RF frontend, and then passed to digital domain (109) with analog-digital converter (107) and further then it performs the switching of the signal by transmitting the signal to the FPGA (110). The signal switched in the FPGA (110) is sent to the related digital-analog converter (107) to be routed to the related output port. The digital-analog converter (112), on the other hand, sends the signal analog to one of the micro-miniature output connectors (114) on the output, and performs the reception of the signal from that output port. In the application of the present invention, a structure with a frequency band of 4 MHz-50 MHz (HF band) and 32 inputs and 32 outputs has been implemented specifically.

6 Claims, 8 Drawing Sheets

DIGITAL SWITCHING MATRIX

TECHNICAL FIELD RELATED TO THE INVENTION

The invention covers the systems in areas such as high frequency communication systems (High Frequency Communication), electronic intelligence systems (Electronic Intelligence—ELINT), monitoring different signals simultaneously in television and satellite communications, and beam forming for phased array systems. It is about the switching the signals coming to the input ports to desired output ports.

STATE OF THE ART

The systems in the state of the art are designed as analog and the function of switching one or more signals to any channel is realized by using RF components such as radio frequency power divider (RF splitter), RF switch and RF power combiner. In existing analog systems, after the signal is received from any port, first the level of the signal is amplified with the help of an amplifier and filtered in the relevant band gap. Then, the signal is divided into multiple signals with the help of a signal divider and given to the input ports of the switches. If the signals waiting at the input port of the switches are desired to be received from which output ports, the relevant switch of that port is turned on and the signals are combined in the RF combiner and switched to the relevant output ports. Even in the simplest structures of existing analog systems, too many RF cards are used to provide the matrix structure, and the size of the cards is very large due to the structurally large RF components used, thus increasing the size of the system considerably. The large RF cards in the existing systems cause the RF lines to be long and increase the power loss of the system considerably. In existing analog switching systems, more than one amplifier is used to compensate for this loss, which greatly increases the cost and complexity of the system. In analog systems, more than one switch is cascaded to solve the isolation problem between analog ports, which leads to extra costs.

When the literature on digital switching matrix systems is examined, no patents and studies similar to the current patent application have been found. The inventions that can be considered the closest in terms of content and title are listed below, and the technical differences of these inventions are also indicated.

In the patent document numbered U.S. Pat. No. 5,451, 936, N×M non-blocking switching matrix consists of a three-segment structure consisting of input, output and middle section. These structures are configured using a large number of switches within themselves. Therefore, using too many switches has increased the power loss of the input signals and necessitated the use of amplifiers to tolerate this loss. This increases the cost of the system. In the present invention, no electronic switch is used. In addition, the use of amplifiers is kept to a minimum (one for each RF line) and the cost is very low compared to the above patent.

In the patent document numbered US005451936A, the classical switching method was applied and developed as N×M non-blocking switching matrix. This structure is used as the general structure in today's existing switching matrices and increases both the complexity of the system and the cost according to the desired number of input and output ports. In the present invention, switching can be done in the FPGA and directed to the desired ports.

Technical Problem and Technical Solution that the Invention Aims to Solve

The object of the present invention is to reduce the complexity of the system by removing the component complexity found in analog switching matrix systems. Accordingly, in the present invention, RF line lengths will decrease/shorten with the decrease in complexity and number of components, so line losses will be less than analog systems in the state of the art.

After the analog signals (142) coming to the switching matrix are amplified and filtered by the amplifier (102), the analog signals (142) will be converted into digital signals after being sampled by analog-to-digital converters (Analog Digital Converter—ADC) (107). Then, these digital signals (111) are given directly to the field programmable logic gates (Field Programmable Gate Array—FPGA) (110) and all switching operations are done in the FPGA (110).

The fact that all switching processes are carried out in the FPGA means getting rid of all the components such as RF switch, RF power divider, RF power combiner to be used in the system and reducing the cost to a large extent (the cost of the system is 1:8 or 1:10 compared to its current analog equivalent). The digital signal (111) switched in the FPGA is received from the relevant output port (114) with the help of the digital-analog converter (Digital-Analog Converter—DAC) (112), and the analog signal (142) converted from digital to analog signal with DAC is directly output. Outputting the signal directly to the output means that the signal follows a short transmission line in distance and the power loss of the signal is very low. Therefore, there is no need to use more than one amplifier in the system and accordingly the complexity of the system is reduced. Thus, the system becomes compact.

EXPLANATION OF REFERENCES IN FIGURES

100: Antenna
101: Micro Miniature Coaxial Input Connector/Input port
102: 5 MHz-1500 MHz RF Amplifier

103: CH1, 1. Channel
104: CH2, 2. Channel
105: CH3, 3. Channel
106: CH4, 4. Channel
107: Four Channel Analog Digital Converter
108: Logic Gate Cells
109: Programmable Interconnects-Digital Environment
110: Field Programmable Logic Gates (FPGA)
111: Digital Signal
112: Four Channel Digital Analog Converter
113: Digital to Analog Converter Channel
114: Micro Miniature Coaxial Output Connector/Output port
115: 0.4 MHZ-800 MHZ RF Converter
116: Surface Mount Capacitor
117: Four Channel Analog Digital Converter on PCB
118: 50 MHz Low Pass Filter
119: DC-7000 MHz RF Amplifier
120: Voltage Controlled Oscillator
121: Single Input 16 Output Signal Divider
122: Two Input Single Output Signal Combiner
123: Surface Mount Resistor
124: FPGA Protective Cover
125: FPGA Control Pins/Connectors
126: Buffer/Line Drivers
127: FPGA Main Power Connector
128: FPGA External Power Connector
129: 50 MHz Output Filter
130: Micro Miniature Coaxial Output Connector on PCB
131: Four Channel Digital Analog Converter on PCB
132: RF Output Transformer
133: Surface Mount High-Q Inductor
134: Representative Input Connector
135: Possible Switching Combinations
136: Representative Input Connector Notation
137: Micro Miniature Coaxial Input Connector on PCB
138: Surface Mount High-Q Capacitance
139: 5 MHz-300 MHz RF Converter
140: Input Signal
141: Transferring the Analog Signal to Digital Domain with ADC
142: Analog Signal
143: Selection of Relevant Input Port over FPGA according to the data from the Interface
144: Selection of Relevant Output Port over FPGA according to the data from the Interface
145: Converting the Digital Signal to Analog Domain with DAC
146: Output Signal

DISCLOSURE OF THE INVENTION

Figure 1:
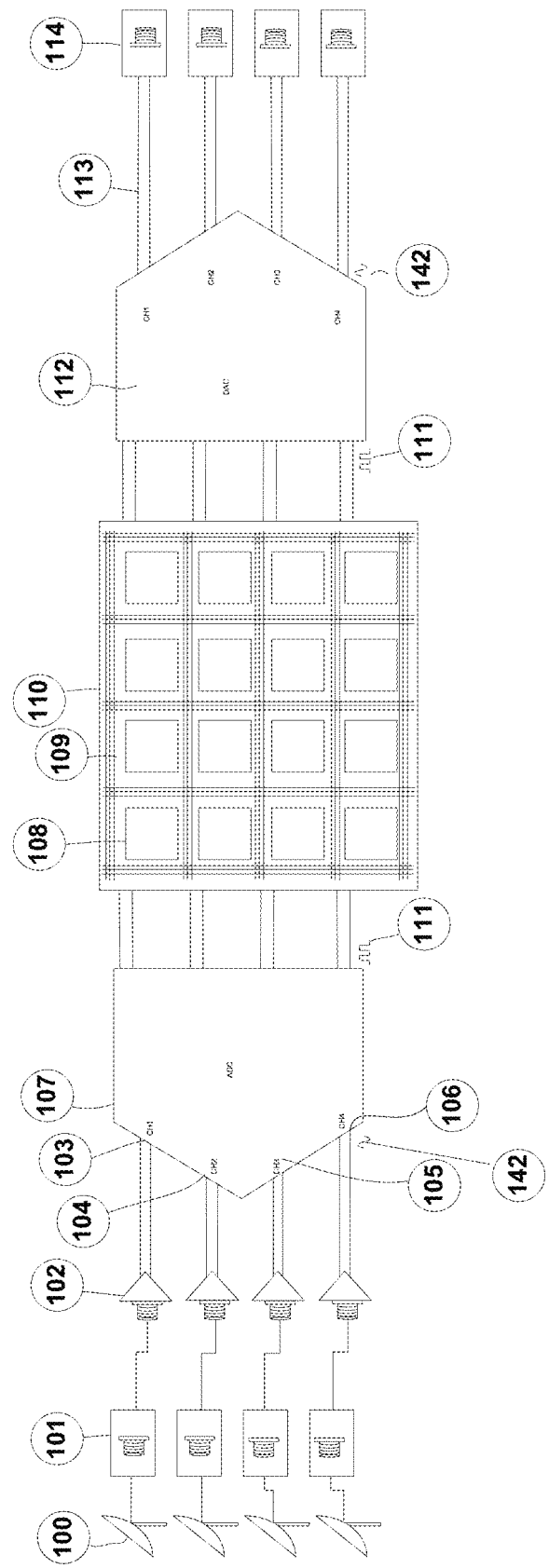
FIG. 1—It is a demonstration of the entire block structure of the developed digital switching matrix.
Figure 2:
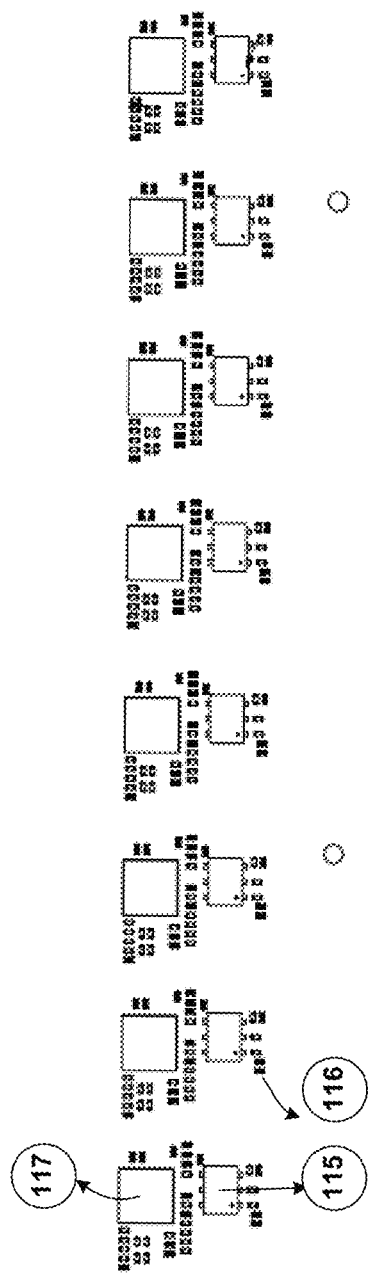
FIG. 2—It is the illustration of the block with four-channel eight analog-to-digital converters of the developed digital switching matrix.
Figure 3:
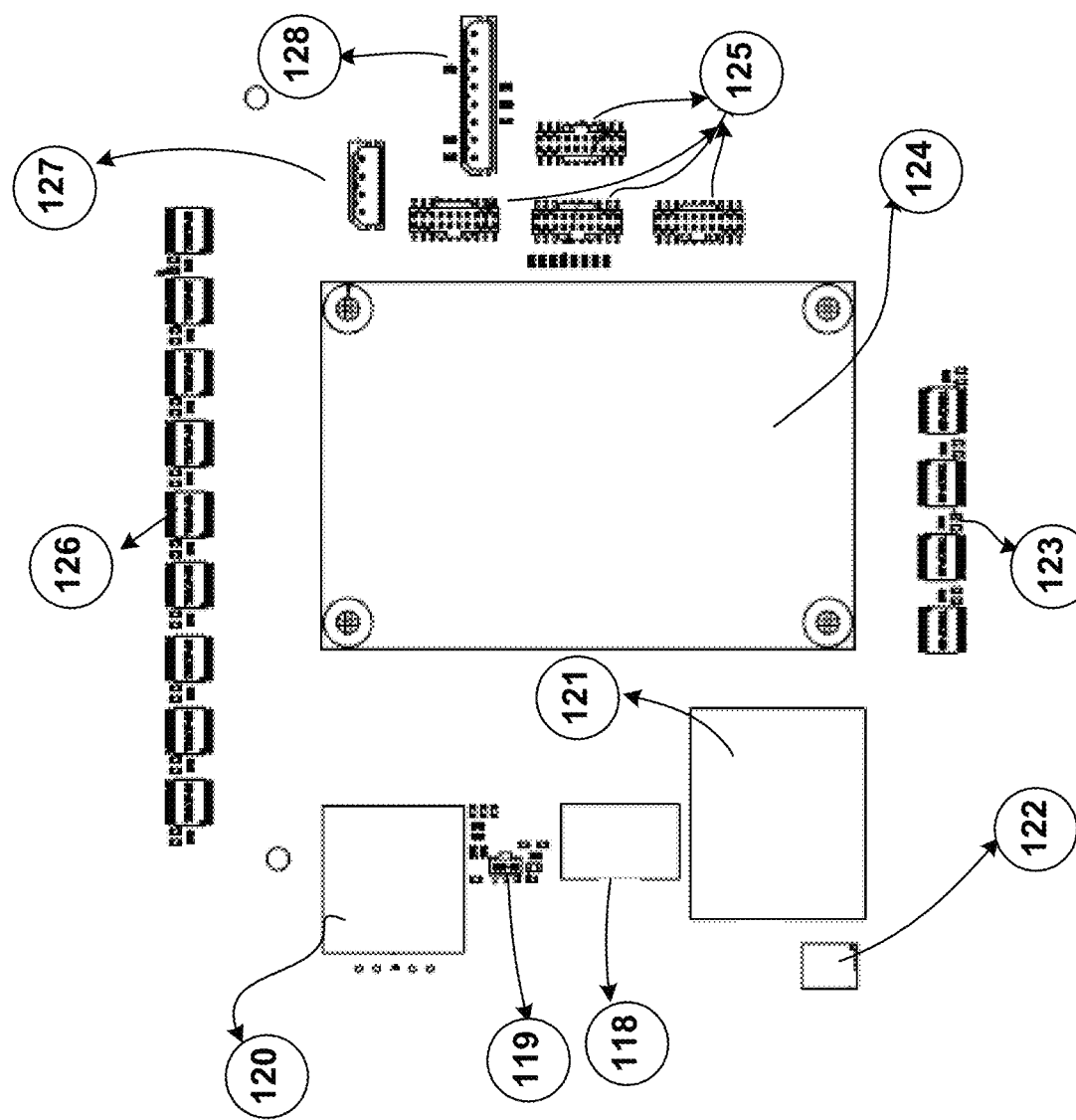
FIG. 3—It is the representation of the block with programmable logic gates (FPGA) in the area where the switching mechanism of the developed digital switching matrix is realized.
Figure 4:
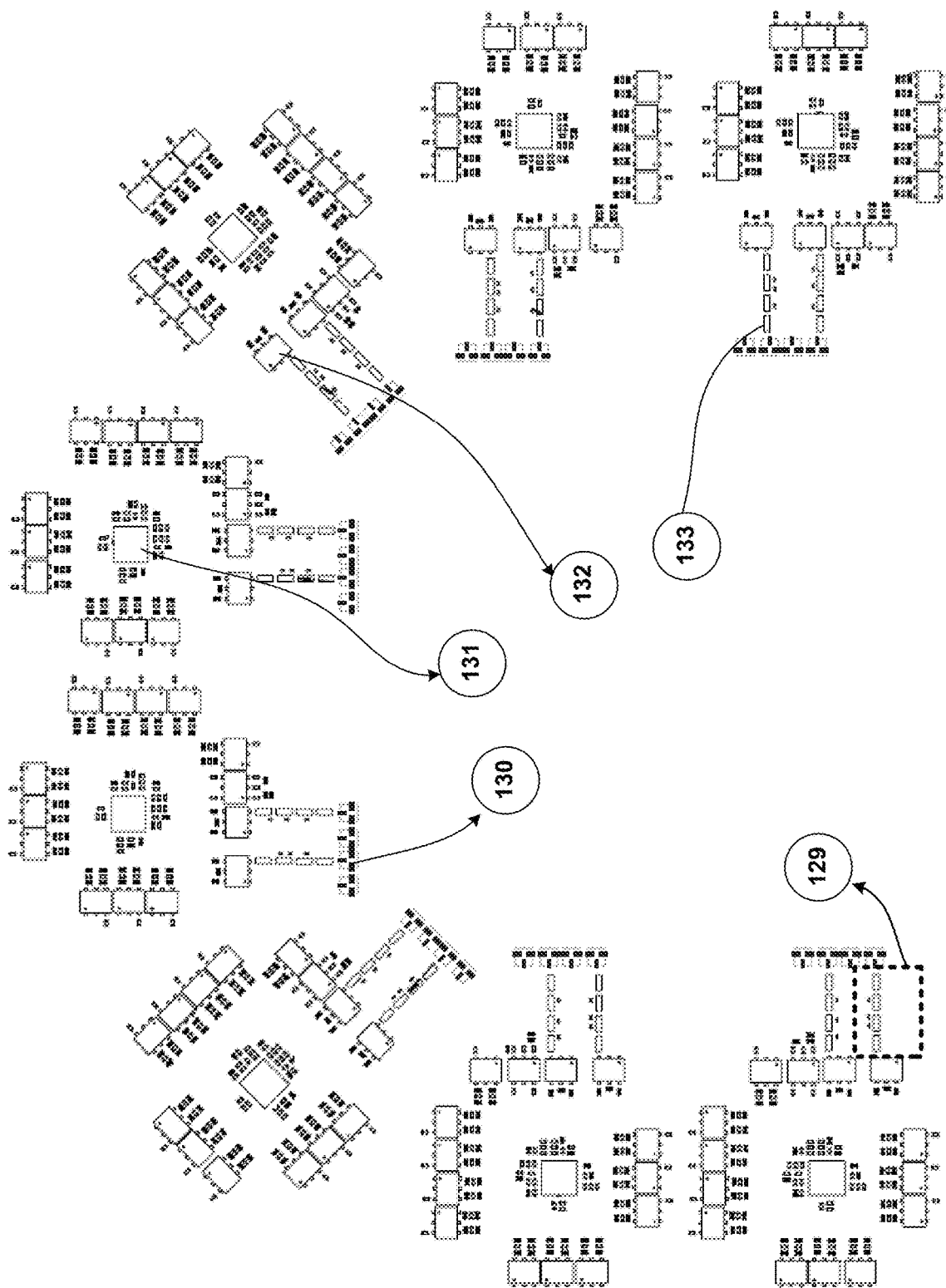
FIG. 4—It is the illustration of the output stage block with four-channel eight digital-analog converters of the developed digital switching matrix.

The present invention consists of receiving analog signals (142) coming from different antennas (100) in the 4 MHz-50 MHz range with micro-miniature coaxial (MMCX) input connectors (101) on a printed circuit, After receiving the signals from MMCX input connectors, they are amplified with 5-1500 MHz RF amplifier (102) then filtering the signals with a filter made of surface mount high Q capacity (138) and surface mount high Q inductances (133), then the signals are converted to differential with RF converter (139) operating at between 5-300 MHz, then transferred to programmable interconnects (109) with an analog to digital converter (107). It includes the ralization of switching functions of the digital signals (111) with the logic gate cells (108) located in the field programmable logic gates (FPGA) (110). The digital signal, which is switched in the programmable interconnects (109), is converted to analog signal with a digital analog converter (112) and passed back to the analog domain (the part after DAC (112)—See FIG. 1), and it is connected with the RF output transformer (132) in the RF output stage. It is converted into a single signal and routed to the corresponding micro-miniature coaxial output connector (114) by means of digital analog converter channels (113).

Since the 5-1500 MHZ RF amplifier (102) on the RF frontend must be present as one at each input port, the number of amplifiers (102) will increase as the number of inputs in the system increases.

The RF converter (115) used in the system also changes depending on the number of inputs. There are at least two RF converters at each input. For example, when the number of inputs and outputs is 4×4, 8 RF converters (115) will be needed and at least 4 RF output transformers (132) will be needed on the output floor.

The mentioned FPGA (110) used in the current system has 504,000 logic cells and has the ability to operate at 454 I/O, 533 MHZ, 600 MHz or 1.3 GHz speeds. The FPGA (110) used in the system contains 900 pins in total.

In the application of the present invention, the matrix structure in the high frequency (HF) band with 32 inputs and 32 outputs is realized specifically. The present invention consists of at least 8 four-channel analog-to-digital converters (107) and at least 8 four-channel digital-to-analog converters (112) with at least one FPGA (110) element and 32 microminiature input connectors (101) and microminiature coaxial output connector (114). All 8 DACs (112) in the present invention are identical to each other. Each of them contains 4 channels and there are 32 channels in total. The system consists of a printed circuit containing all the components mentioned above. Printed circuit refers to all components, including input ports and output ports. Analog to digital converters (ADC) (107), digital to analog converters (DAC) (112), FPGA (110) and all other components are on the printed circuit board.

Figure 6A:
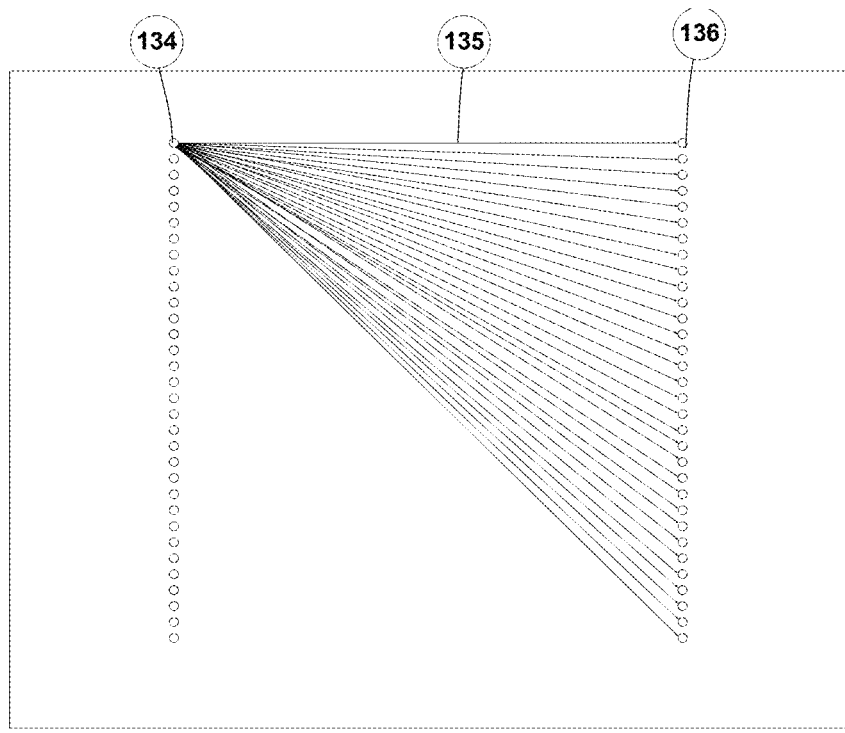
FIG. 6a—It is a demonstration of the full fan-out switching structure of the developed system.
Figure 6B:
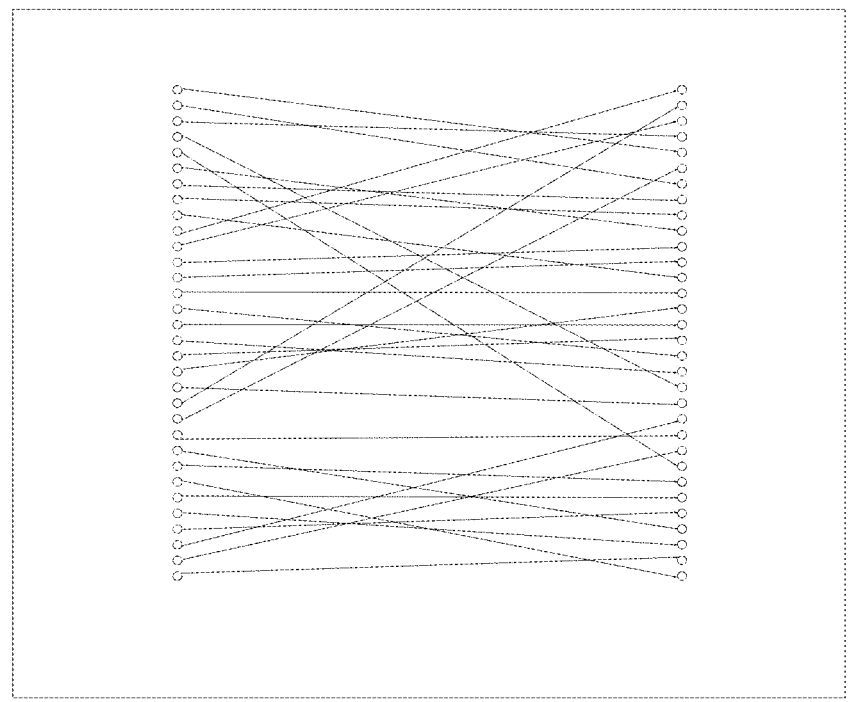
FIG. 6b—It is a demonstration of the non-blocking switching structure of the developed system.
Figure 7:
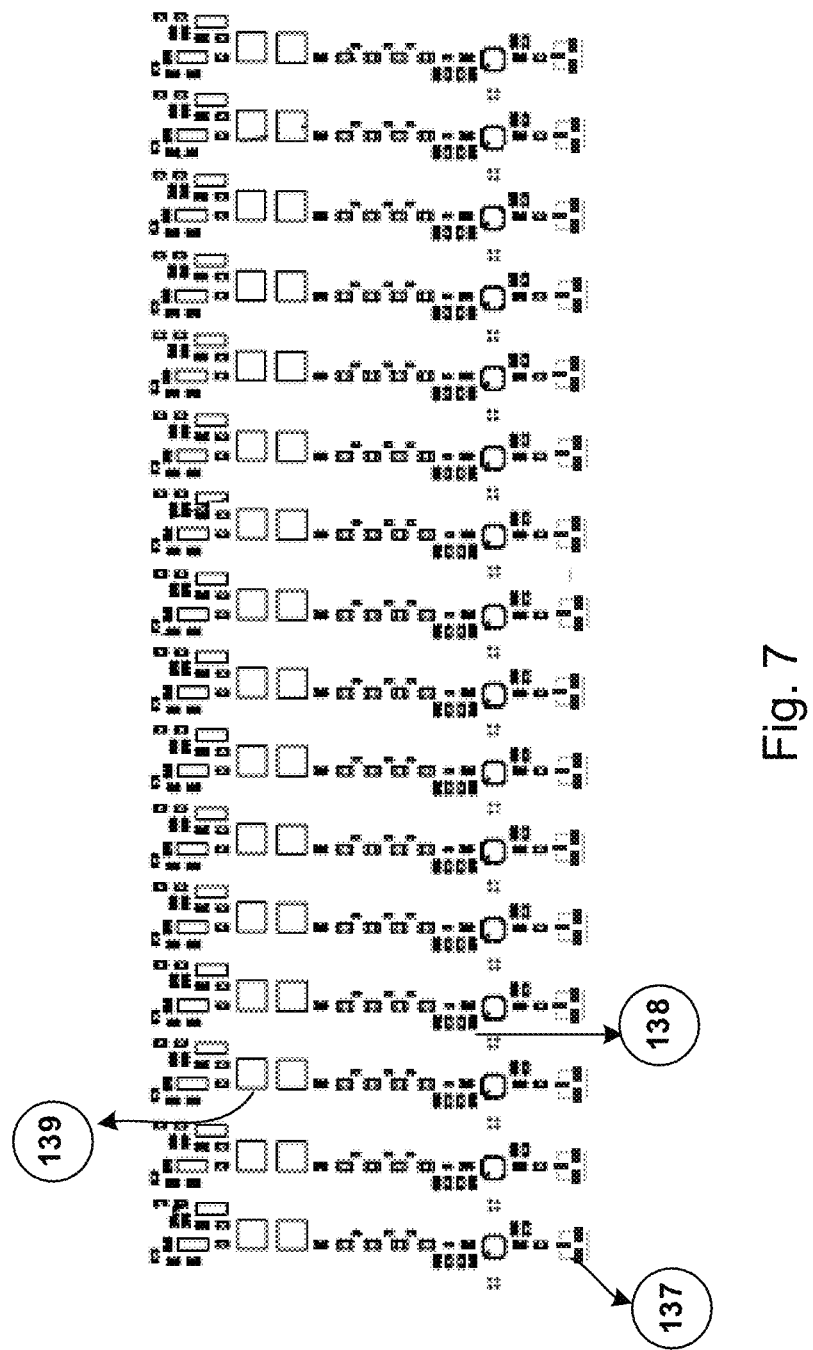
FIG. 7—It is a demonstration of the front floor structure of the developed system.
Figure 8:
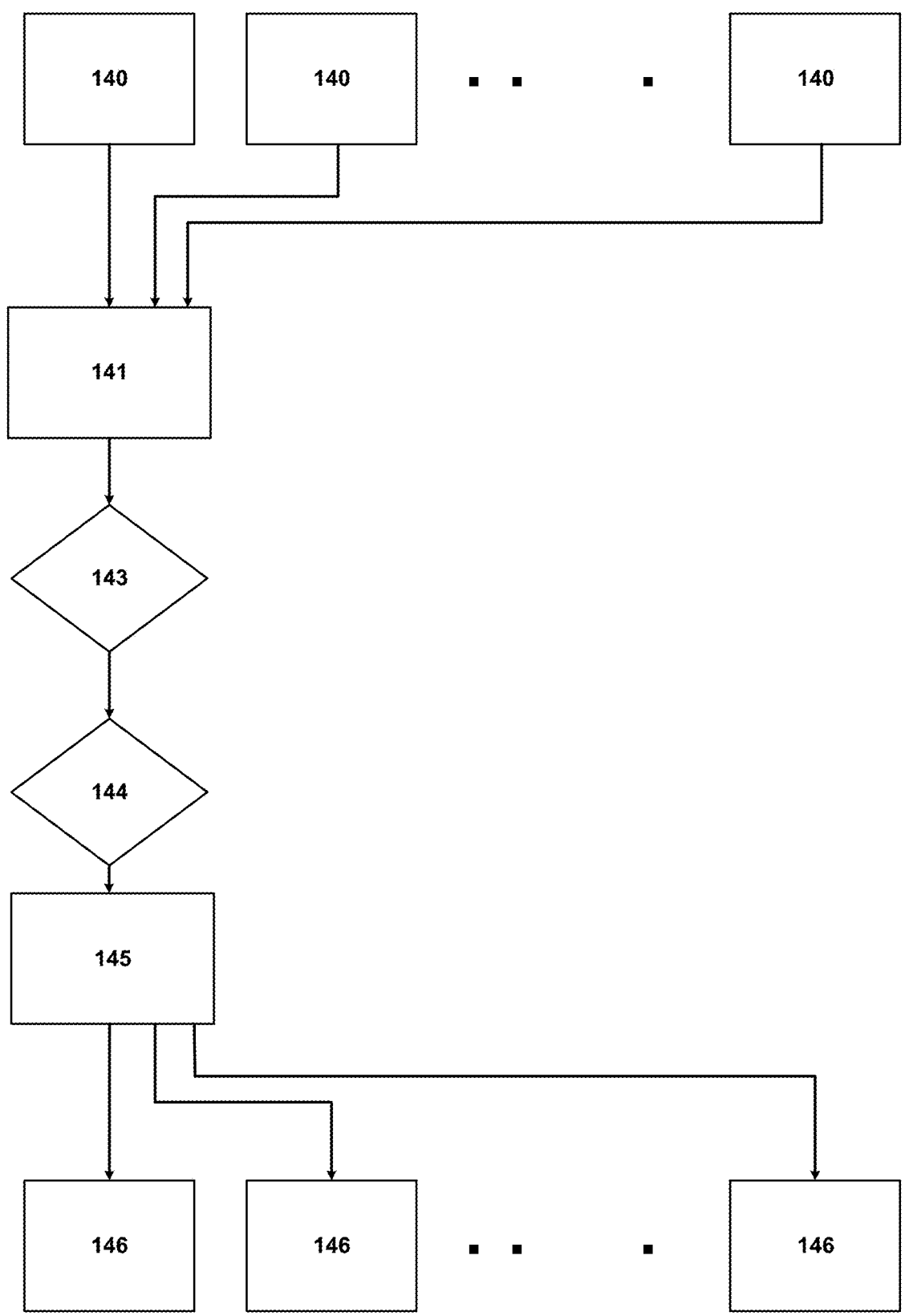
FIG. 8—Flow diagram of the developed system.

This switching matrix system can switch N inputs-N outputs in two different combinations, with N input and output ports, in a way that the inputs and outputs cannot be blocked in both analog and digital environments (non-blocking full fan-out). Here N; expresses a positive integer from 4 to 128, multiples of 4 including 4 and 128. FIGS. 6a and 6b show in which combinations the switching matrix can switch input signals to output ports. For example, for FIG. 6a (full fan-out switching structure), the user can route a single input signal to all outputs simultaneously. FIG. 6b shows that any input can be switched to any output. These switching operations are done with the logic gates in the FPGA. The present invention can do both switching, the choice belongs to the user. For example, the user may want to redirect inputs 1 and 2 to any output 1 to 32. In fact, the user can direct inputs from 1 to 32 to a single output or to different outputs separately. The user can route all signals from inputs 1 to 32 to any output from 32 outputs as desired. Likewise, it can direct these signals to different outputs. For example, it can route the 1st input signal to the 32 nd output and the 2nd input signal to the 15th output. While doing these, any input does not block any output or any other signal.

The present invention does not use any RF switch, RF power combiner or RF power divider. The size of the printed circuit is rectangular and there is at least one FPGA (110) on the board that can operate at 533 MHZ-1300 MHz speeds. All switching functions are performed in a digital environment (109) within a single FPGA (110). In the present invention, an analog to digital converter (107) is used to convert the analog signal (142) to digital. Likewise, after the analog signal (142) is converted to digital and switching function is performed in the FPGA (110), the signal is given to the related digital-analog converter (DAC) (112) to be directed to the desired output.

Figure 5:
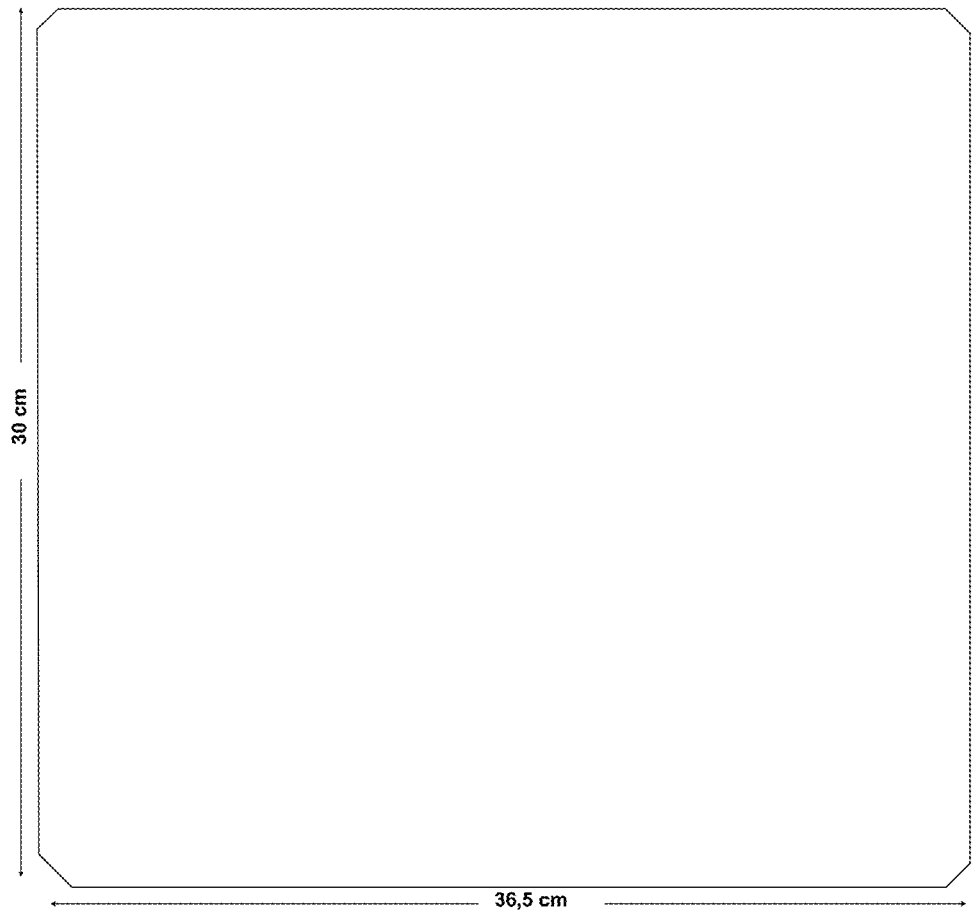
FIG. 5—It is a representation of the size of the developed system.

The presented invention can also be implement in bands such as very high frequency (VHF), and L-band. The present invention can be used in high frequency (HF), in the 4-50 MHz frequency band and has been realized in a low cost and very small size of 30×36.5 cm (FIG. 5) for the multi-antenna-multi-receiver (32×32) switching need. However, this size may vary depending on the amount of input-output and the designer. Since the size of the system can be designed to have at least 4 inputs and 4 outputs, the size of the system can be at least 8×10 cm. The larger the number of inputs and outputs, the larger the size will be. In the application of the present invention (32 inputs 32 outputs), 8 ADCs (107) and 8 DACs (112) are used. Other embodiments of the present invention are noted in the examples below.

Example 1

In an embodiment of the present invention, a switching matrix system comprising; at least 1 four-channel analog-to-digital converter (107) and at least 1 four-channel digital-to-analog converter (112) and at least one FPGA (110) element, 4 microminiature input connectors (101), 4 microminiature output coaxial connectors (114), at least 4 amplifiers (102) and at least 8 RF converters (115), and at least 4 RF output stage transformers (132) is disclosed. The size of the switching matrix system designed in this way 4×4 can be at least 8×10 cm.

Example 2

In an embodiment of the present invention, a switching matrix system comprising; at least 2 four-channel analog-to-digital converters (107) and at least 2 four-channel digital-to-analog converters (112) and at least one FPGA (110) element, 8 microminiature input connectors (101), 8 microminiature coaxial output connectors (114), at least 8 amplifiers (102) and at least 16 RF converters (115), and at least 8 RF output stage transformers (132) is disclosed. The size of the matrix designed in this way 8×8 can be at least 14×16 cm.

Example 3

In one embodiment of the present invention, a switching matrix system comprising; at least 16 four-channel analog-to-digital converters (107) and at least 16 four-channel digital-to-analog converters (112) and at least two FPGA (110) elements, 64 microminiature input connectors (101), 64 microminiature coaxial output connectors 114, at least 64 amplifiers 102 and at least 128 RF converters (115), and at least 64 RF output stage transformers (132) is disclosed. The size of the matrix designed as 64×64 in this way can be at least 30×36.5 cm. Since the matrix structure to be designed as 64×64 cannot be designed as a single card, a 64×64 matrix structure can be obtained by using 2 of the existing 32×32 matrix structure. However, in the system, unlike the 32×32 system, it may be necessary to have a main control card to control the FPGA (110) on each card.

Example 4

In one embodiment of the present invention, a switching matrix system comprising; at least 32 four-channel analog-to-digital converters (107) and at least 32 four-channel digital-to-analog converters (112) and at least four FPGA (110) elements, 128 microminiature input connectors (101), 128 microminiature coaxial output connectors (114), at least 128 amplifiers (102) and at least 256 RF converters (115) and 128 RF output stage transformers (132) is disclosed. The size of the matrix designed as 128×128 in this way can be at least 30×36.5 cm. Since the matrix structure to be designed as 128×128 cannot be designed as a single card here, a 128×128 matrix structure can be obtained by using 4 of the existing 32×32 matrix structure. However, in the system, unlike the 32×32 system, it may be necessary to have a main control card to control the FPGA (110) on each card.

INDUSTRIAL APPLICATION OF THE INVENTION

The present invention is used in design verification and production tests in the defense industry, wireless communication, aerospace industry. Switching matrices are used in multi-antenna-multi-receiver switching, TV and satellite systems, multi-port measurement setups, beaming in phased array antenna systems. With the developed method, a cost effective product has been created. In the present invention, unlike the classical switching mechanism, each input port can be connected to output ports independently of each other, and one input can be connected to more than one input at the same time. In the application presented with this invention, since the switching function is made in the FPGA (110), filtering and various mathematical operations that can be applied in the digital environment can be applied to the signal. This provides a wide application freedom for the operator.

The invention claimed is:

1. A digital switching matrix comprising, at least one four-channel analog-to-digital converter-ADC (107), at least 1 four-channel digital to analog converter-DAC (112), at least 1 FPGA (110) element with logic gate cells (108) inside and at least 4 Micro Miniature Coaxial Input Connectors (101) receiving incoming analog signals (142) and at least 4 Micro Miniature Coaxial Output Connectors (114) receiving digital signals (111), at least 4 amplifiers (102), at least 8 RF converters (115), at least 4 RF output transformers (132) and programmable interconnects (109).

2. A working method of a digital switching matrix, characterized in that after analog signals (142) coming to input connectors (101) are amplified and filtered by amplifier (102), sampling the analog signals (142) with analog-to-digital converter (ADC) (107) the signal converted to the digital signal (111) is directly fed to FPGA (110) and switching the signal in the programmable interconnects (109) with the logic gate cells (108) in the FPGA (110).

3. The working method of the digital switching matrix according to claim 2, wherein the N input connectors (101)—the N micro miniature coaxial output connectors (114), both are switched via programmable interconnects (109), in such a way that inputs and outputs do not block each other.

4. The working method of the digital switching matrix according to claim 3, characterized in that N is a positive integer from 4 to 128, including 4 and 128, and multiples of 4.

5. The working method of the digital switching matrix according to claim 3, characterized in that transferring the digital signal (111) which is switched in the programmable interconnects (109) to the analog domain again with the digital analog converter (DAC) (112) and converting the digital signal into a single signal with the RF output transformer (132) and routing the single signal to corresponding micro-miniature coaxial output connector (114) by means of digital analog converter channels (113).

6. The working method of the digital switching matrix according to claim 3, characterized in that receiving the digital signal (111), which is switched in the FPGA (110), to an output port (114) using the digital analog converter (DAC) (112) and the signal (142) converted from the digital signal (111) to the analog signal (142) with the DAC (112) directly to desired micro-miniature coaxial output connector (114).

\* \* \* \* \*